United States Patent [19]

Hewes et al.

[11] 4,218,752

[45] Aug. 19, 1980

[54] CHARGE-TRANSFER PROGRAMMABLE FILTER

[75] Inventors: Charles R. Hewes, Richardson; Dale J. Mayer, Dallas, both of Tex.

[73] Assignee: Texas Instruments Incorporated, Dallas, Tex.

[21] Appl. No.: 895,415

[22] Filed: Apr. 11, 1978

[51] Int. Cl.[2] .......................... G06G 7/16; H03K 5/159
[52] U.S. Cl. .................................. 364/825; 333/165; 364/604; 364/724
[58] Field of Search ............... 364/604, 724, 728, 824, 364/825, 862; 357/24; 333/165

[56] References Cited

U.S. PATENT DOCUMENTS

| | | | |
|---|---|---|---|
| 3,670,151 | 6/1972 | Lindsay et al. | 364/728 |
| 3,935,439 | 1/1976 | Buss et al. | 364/824 |
| 3,952,188 | 4/1976 | Sloate et al. | 364/825 |
| 3,979,582 | 9/1976 | Mims | 364/825 |
| 3,987,292 | 10/1976 | Means | 364/604 |
| 3,987,293 | 10/1976 | Crooke et al. | 364/825 |
| 4,034,199 | 7/1977 | Lampe et al. | 364/825 |
| 4,035,628 | 7/1977 | Lampe et al. | 364/825 |
| 4,058,717 | 11/1977 | Engeler | 364/824 |
| 4,100,513 | 7/1978 | Weckler | 364/825 |
| 4,120,035 | 10/1978 | Cases et al. | 364/825 |
| 4,149,128 | 4/1979 | White | 333/165 |

*Primary Examiner*—Felix D. Gruber
*Attorney, Agent, or Firm*—William E. Hiller; Melvin Sharp; James T. Comfort

[57] ABSTRACT

A one bit by N correlation digitally programmable filter comprising a multi-phase charge-transfer shift register whose phase are selectively clocked to achieve the programming. One phase is coupled to an integrator circuit that generates an output voltage proportional to the sum of the charged packets transferred. The clocking cycle is repeated sequentially to generate other selected summations. A plurality of correlators are utilized in parallel to perform an M bit by N correlation.

32 Claims, 10 Drawing Figures

CHARGE-TRANSFER PROGRAMMABLE FILTER

BACKGROUND OF THE INVENTION

The present invention relates in general to signal processing systems, and more particularly, to a digitally programmable charge-transfer filter.

Charge-transfer devices are uniquely applicable to many analog signal processing functions because they are capable of operating directly with analog signals. One of the most important signal processing functions for which charge coupled devices can be used is the time delay of analog signals. A number of charge-transfer devices have been developed for signal processing, of which the transversal filter or multi-tap delay line has special importance. In addition to being a natural architecture for charge-transfer devices, it is a general purpose device in the sense that any desired finite impulse response can be obtained if tap locations and weights can be arbitrarily assigned. The structure in which taps weights and locations can not only be arbitrarily assigned but can also be electrically varied has even more significance in the context of digital processing, for such a device could be automatically programmed to perform a wide range of linear signal processing functions.

A transversal fitler can have an arbitrary impulse response of finite time duration and therefore can be used to implement a wide variety of linear filters. (Any system whose output is linearly related to the input is a linear filter). In this sense, a transversal filter can be thought of as the fundamental building block of linear systems. Since the impulse response of a charge-transfer transversal filter can be selected arbitrarily, these filters can be matched to any desired signal wave form of finite duration, in which case the filter is called a matched filter. Matched filters are used to detect a gain waveform in the presence of noise with optimum detection probability. Charge-transfer matched filters are useful, for example, in low data rate spread spectrum communication systems.

However, charge-transfer transversal filters can also be designed to achieve a particular spectral characteristic by frequency filtering. A linear phase bandpass filter can be constructed by selecting the impulse response of a transversal filter to be the Fourier transform of the desired frequency characteristic. One of the advantages of such filters is that their frequency characteristic scales with the clock frequency and by varying the clock frequency the filter can be tuned.

Another application of the charge-transfer transversal filter is that of auto or cross correlation. In the processing of electrical signals, it is often required to extract a signal from a noise background. This is often effected using auto correlation or cross correlation techniques. Such auto correlation is typically effected using devices generally referred to as matched filters, transversal filters and chirp filters. However, the charge-transfer transversal filter can be made by nondestructively sampling each charge packet in a charge coupled device delay line, multiplying the samples by weighting coefficients, then summing the results. Circuitry for performing the sampling, weighting and summing functions is integrated with the charge-transfer device in a single IC. Fixed weighting coefficient filters are factory programmable in the sense that the code or impulse response is determined by a single photomask which is used in the IC manufacture.

Many important analog signal processing functions, however, require variable weighting coefficient filters. Variable weighting coefficient filtering applications may be separated into categories: (1) convolution with an impulse response which is fixed for long periods of time but which must be varied slowly or changed frequently, and (2) convolution or correlation of two arbitrary waveforms.

One important application in the former category is matched filtering on a waveform which changes intermittently. Another important application in the former category is adaptive equalization in which the dispersion due to a changing transmission medium must be inverted in the receiver or MODEM.

Several approaches have been proposed to provide electronically variable weighting coefficients. In "CCD MNOS Devices For Programmable Analog Signal Processing and Digital Non-volatile Memory", N. H. White, D. R. Lampe, and J. L. Fagan, 1973 International Electron Devices meeting, Tech. Dig., PP. 130–133, MNOS transistors have been proposed as a means of varying filter weighting coefficients. The conductance of the respective transistor is programmed by the analog voltage applied to the gate. This approach has two limitations which hinders the cost effectiveness: (1) the MNOS circuitry introduces added processing complexity and corresponding added cost, and (2) the off chip circuitry required to program the MNOS conductance is formidable. In "Intracell Charge Transfer Structure for Signal Processing", J. J. Tiemann, W. E. Engeler, R. D. Baertsch, and D. N. Brown, IEE Transactions or Electron Device, ED-21, PP. 300–308, May 1974, an approach is presented for implementing a fully programmable transversal filter using a charge sloshing technique. This technique also suffers from the introduction of added processing complexity and correspondingly added costs.

Accordingly, an object of the present invention is to provide a digitally programmable charge-transfer filter.

Another object of the present invention is to provide a charge-transfer transversal filter having electronically variable tap weights.

Yet another object of the present invention is to provide an M-bit by N correlation digitally programmable filter comprised of a multiphase charge-transfer shift register.

SUMMARY OF THE INVENTION

One embodiment of the one bit by N correlation digitally programmable filter of the invention includes a two phase charge coupled shift register. The first phase of each stage is selectively clocked to achieve the programming. During a first time interval, the first phase of each stage is held at a relatively low voltage to trap signal charge packets in the second phase wells. During a second time interval, the first phase clock is applied to selected stages of the shift register. In those stages where the first phase clock is applied, the charge packets move from the second phase wells to the first phase wells of the next cell. The second phase of each cell is coupled to an integrator which generates an output voltage proportional to the sum of the charge packets which were transferred. The second phase of each cell is held at an intermediate potential of a phase and a half allowing charge packet transfer by clocking only the first phase electrodes. During a third time interval, a first phase clock is applied to the remaining first phase of each cell thereby transferring all charge packets to the first phase wells. The first, second, and third time intervals are repeated sequentially to generate other selected summations of the charge packets. N binary shift registers are utilized to generate the selectable first phase clock signals for each stage of the correlator. A plurality of such correlators are utilized in parallel to form an M bit by N correlation. The output of the integrator of each one bit correlator is weighted by a factor of $2^N$.

In another embodiment, a four-phase CCD serial register is employed to implement the present invention. The first and second phase electrodes are selectively clocked to provide the desired programmed output. The third phase electrode is held at a barrier potential while the fourth phase electrode is held at an intermediate potential. An integrator output amplifier is tied to the fourth phase electrodes to sum the sensed charge packets during the time interval between time period $T_2$ and time period $T_3$ as later defined.

BRIEF DESCRIPTION OF THE DRAWINGS

The invention, taken with those various features and advantages, can be easily understood from the following more detailed description taken in conjunction with the accompanying drawings in which.

DETAILED DESCRIPTION

Figure 1:
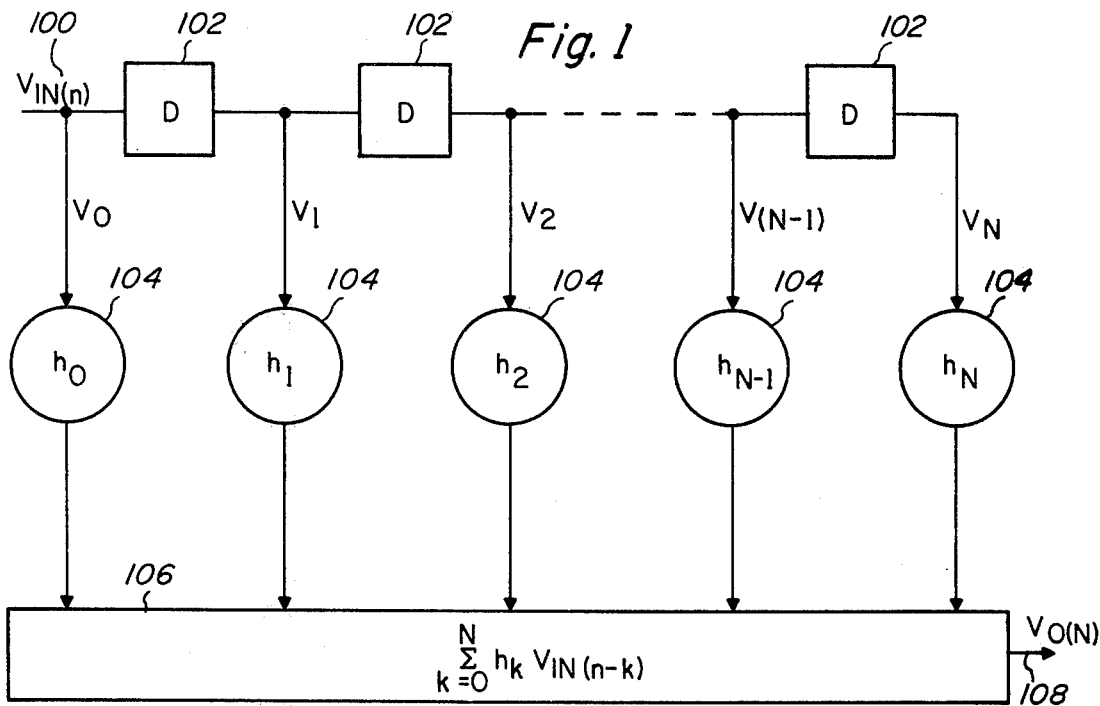
FIG. 1 is a block diagram of a transversal filter showing delay stages D and weighting coefficients $h_N$ for $n = 0, N$.

In FIG. 1 a block diagram of a transversal filter is shown, consisting generally of a plurality of delay stages 102 each of which delays the signal by a time equal to an integral number of clock periods. The signal 100, $V_0, V_1, V_2 \ldots V_{(N-1)}, V_N$, is non destructively sampled at each delay stage, multiplied by the appropriate tap weight 104, $h_n$ $(n=O,N)$, and the weighted signals are summed together at 106 to give the filter output 108. As can be seen from FIG. 1, the tap weights $h_n$ determine the impulse response, or Greens function, of the filter, i.e., the output that results when a single sample of unit amplitude is applied to the input.

Figure 2:
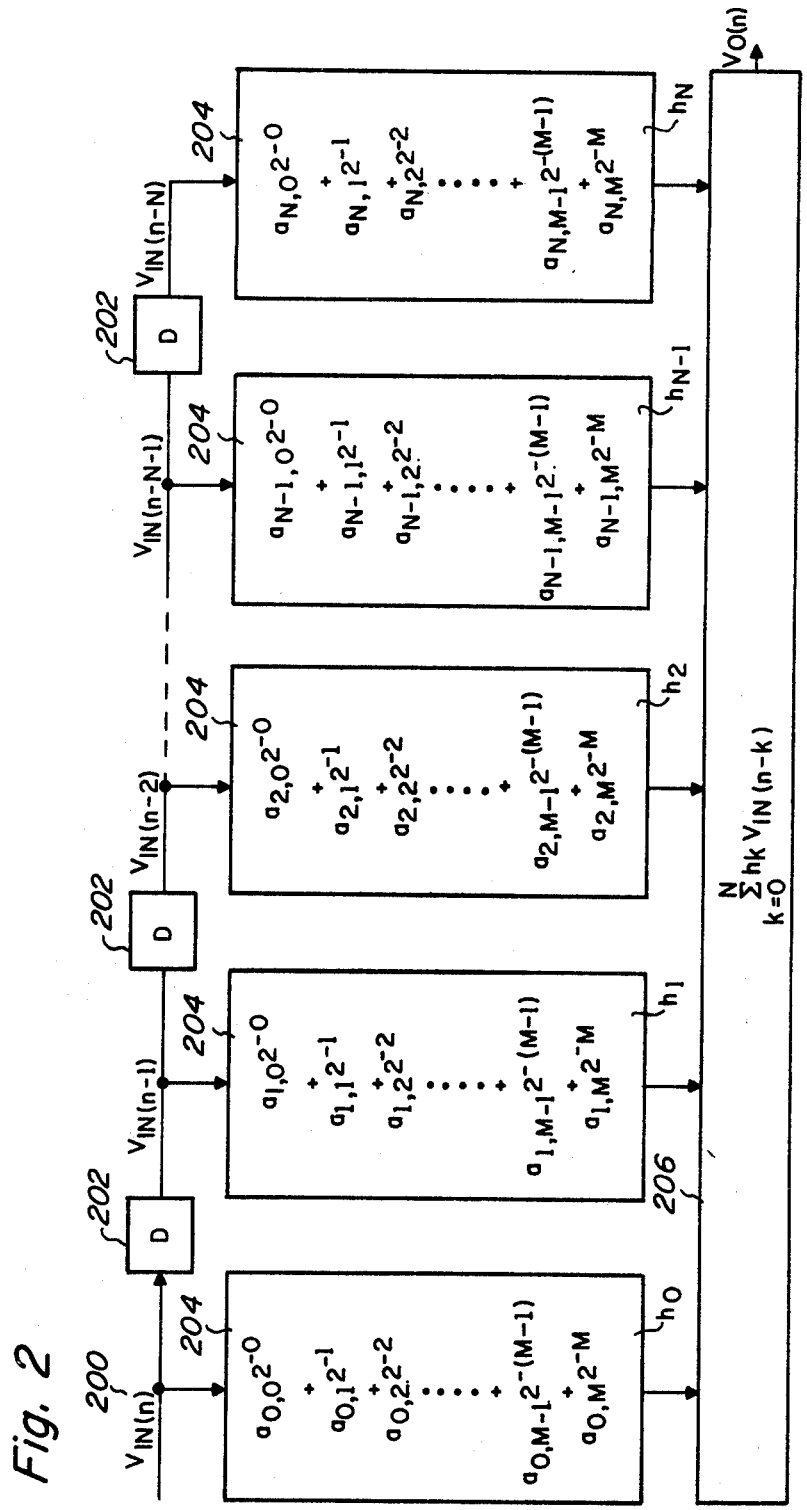
FIG. 2 is a block diagram of a transversal filter having variable weighting coefficients $h_N$ represented by the sum of a series of digital coefficients.

In somewhat greater detail in FIG. 2, discrete bits of an analog delay line are illustrated, generally at 202. By way of example, these bits can be defined by a semiconductor charge coupled device analog shift register. Information in the form of electrical charge is inputted to the delay line at 200. This information is illustrated as being a voltage as a function of time. The signals $V_{IN(n)}$, $V_{IN(n-1)}, V_{IN(n-2)} \ldots V_{IN(n-N-1)}, V_{IN(n-N)}$ represent parallel tapped outputs from the analog delay line. Rectangles 204, $h_0, h_1, h_2 \ldots h_{(N-1)}, h_N$, represent tap weights that are digitally programmable and block 206 labeled $$\sum_{k=0}^{N} h_k V_{IN(n-k)}$$

is the desired signal output of the transversal filter. As can be seen, input signals are fed serially into the delay bits labeled D in blocks 202; and tapped parallel outputs are weighted by weighting functions $h_0 - h_N$ to form the convolution operation of the transversal filter.

To obtain a greater understanding of transversal filter systems, reference is made to U.S. Pat. No. 3,543,009 issued on Nov. 24, 1970.

In the programmable filter of the present invention, the tap weights $h_0 - h_N$ can be electronically programmed and changed to a desired value. As indicated in FIG. 2, the mathematical representation of the programmable tap weights 204 is illustrated as an arithmetic series. Each of the tap weights $h_0 - h_N$ is represented as a fractional binary number by the following; $h_N = a_{N,0} 2^{-0} + a_{N,1} 2^{-1} + a_{N,2} 2^{-2} + a_{N,M-1} 2^{-(M-1)} + a_{N,M} 2^{-M}$. By digitally programming the coefficients $a_{N,0} - a_{N,M}$ to assume a value of $\pm 1$ or 0, the tap weights $h_0 - h_N$, can be weighted to a value of $0 \rightarrow \pm 2$ minus one LSB bit of $2^{-M}$. Each of the digitally programmed coefficients $a_{N,0} - a_{N,M}$ is multiplied by a value of $2^{-0} - 2^{-M}$ respectively providing for each term in the arithmetic series of the tap weights $h_0 - h_N$. The respective values of $2^{-0} - 2^{-M}$ may be applied to each coefficient by utilizing an amplifier having the appropriate gain for each term in the arithmetic series.

Figure 3:
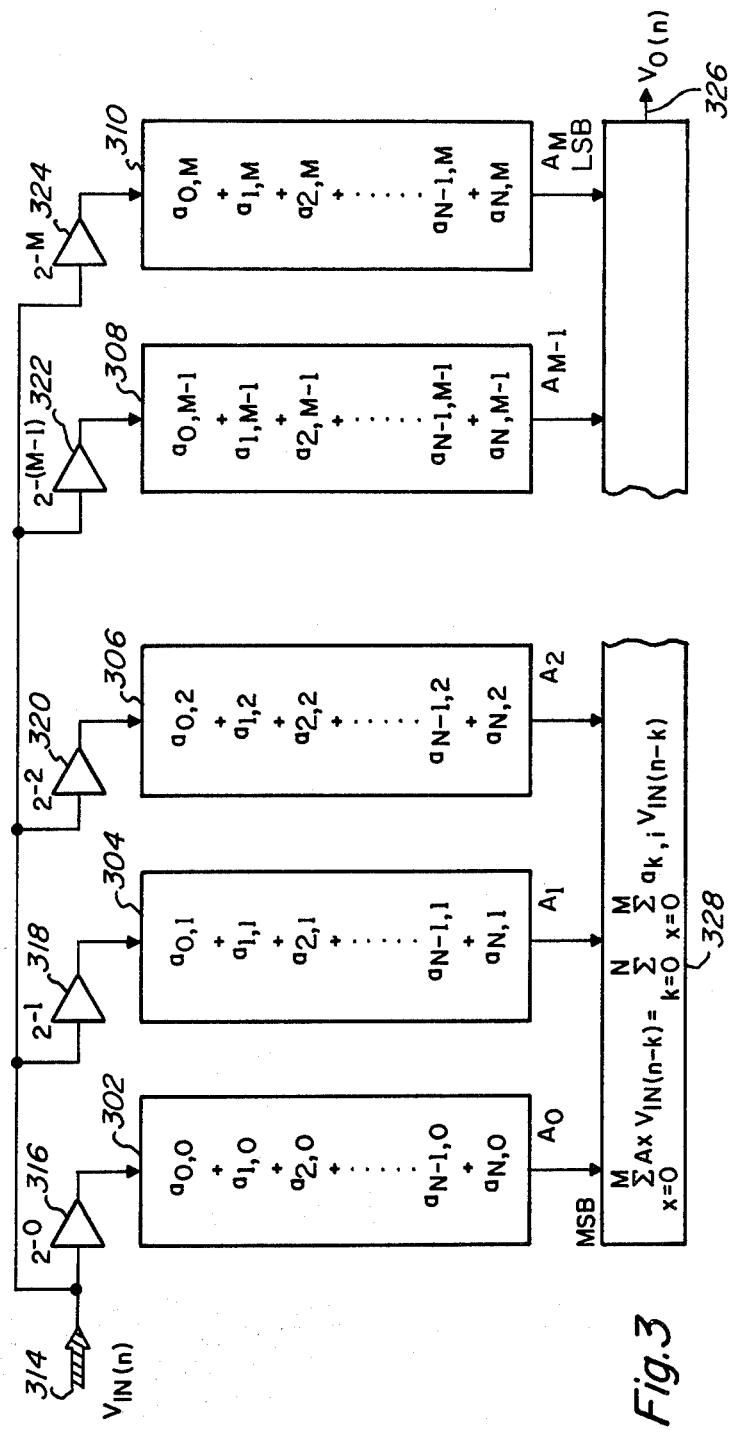
FIG. 3 is a mathematical representation of the digitally programmable weighting coefficients $h_N$.

Referring now to FIG. 3, the mathematical representation of the digitally programmable tap weights employing operational amplifiers for binary weighted gain factors is illustrated. To simplify the implementation of the multiplication of the coefficients $a_{N,0} - a_{N,M}$ by their respective gain terms, each coefficient having a common gain is factored out of the arithmetic series and reorganized to define new programmable tap weights $A_0 - A_M$. The new programmable tap weight $A_0$ is illustrated by the arithmetic series 302 as multiplied by the operational amplifier 316 having a gain of $2^{-0}$. In a similar manner, each programmable tap weight $A_0 - A_M$ illustrated as 302, 304, 306, 308 and 310, is multiplied by a corresponding operational amplifier having appropriate gain for each coefficient. As illustrated, $A_0$ represents the MSB bit and $A_M$ represents the LSB bit of the tap weight. The voltage 314 as a function of time is fed parallel into each of the operational amplifiers 316, 318, 320, 322 and 324, then multiplied by the respective programmable tap weights $A_0 - A_M$ to produce the output $V_{0(n)}$ 326 of the programmable filter. The output $V_{0(n)}$ is illustrated as block 328 whose valve is $$\sum_{X=0}^{M} A_x V_{IN(n-k)} = \sum_{k=0}^{N} \sum_{x=0}^{M} a_{k,i} V_{IN(n-k)}.$$

The operational amplifiers can be placed at the output sides of the programmable coefficient terms instead of at the input sides thereof without changing the value of the output of the programmable filter.

Figure 4:
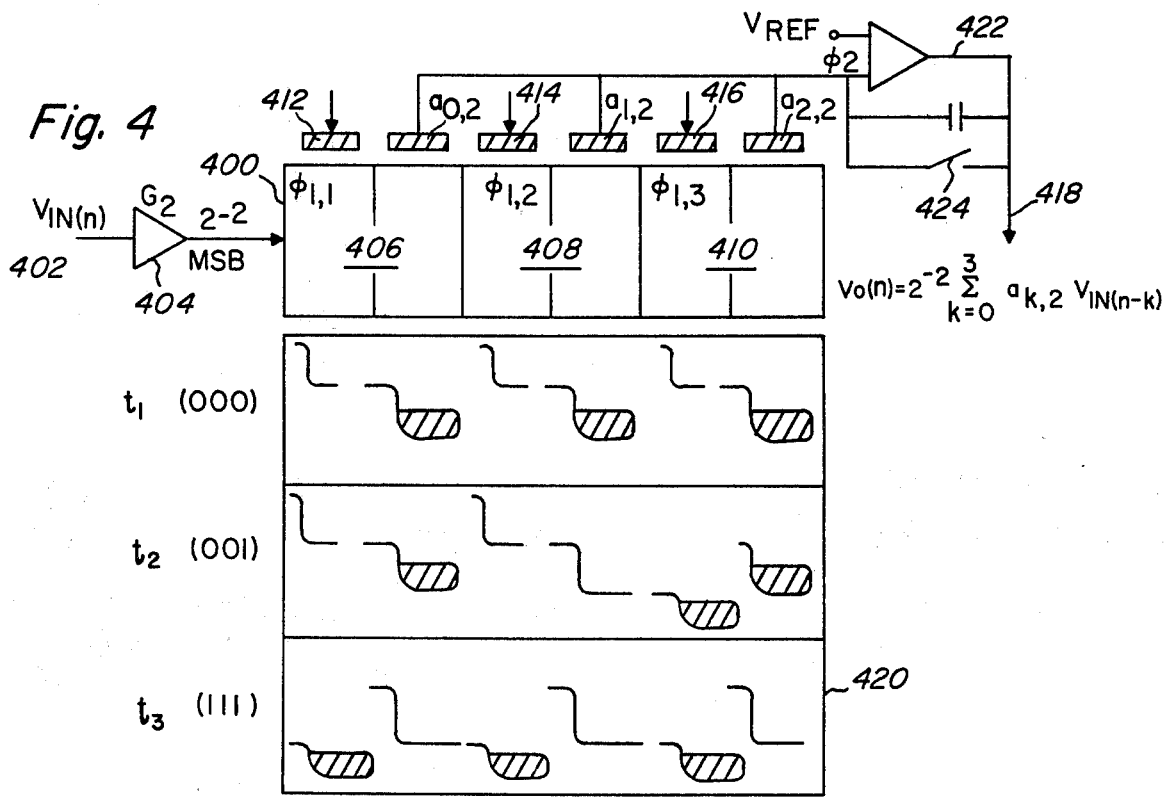
FIG. 4 is a schematic drawing showing the cross section of a transversal filter and potential profiles during one time cycle of the transversal filter convolution operation.

In FIG. 4, a schematic drawing showing a cross section of a programmable transversal filter section and potential well profiles during one timing cycle of the transversal filter convolution operation according to the method of the present invention is illustrated. The architecture in one embodiment of the programmable transversal filter is a two-phase CCD structure 400 comprising an analog shift register having a plurality of delay stages 406, 408 and 410. The two phase CCD structure is fabricated according to the method as described in U.S. Pat. No. 4,027,382, assigned to the same assignee of the present application. The illustrated embodiment represents a three bit by one correlation. The operation of the programmable CCD filter relies on the property of the CCD device that the charge transfer from one electrode to the next requires the receiving electrode to be at a high potential and the sending electrode to be at a low potential. It is apparent to one skilled in the art that using this charge transfer technique, other than two phase CCD structures may be utilized with the method of the present invention such as a three phase or four phase CCD structure including bucket brigade devices and charge transfer devices.

In the operation of the programmable transversal filter, at time $t_1$ the signal charge packets of the CCD reside in the wells under the second phase electrodes. At a later time $t_2$, some of the first phase electrodes are selectively turned on and others are left off. The second phase electrodes will be floating at an intermediate potential (about 5 to 7 volts) which will allow the charge packets to transfer from the second phase electrodes to the corresponding adjacent succeeding first phase electrodes that are turned on. The remaining charge packets under the second phase electrodes will be transferred at a later time $t_3$ when the remaining phase one electrodes are turned on. When the signal charges are transferred to the first phase electrodes, they are summed by the charge integrated circuit. The charges are sensed as they leave the second phase electrodes during a clock cycle. It is the decrease in potential or absence of charge packets under the second phase electrode that provides the programmed output signal. In the time interval between $t_2$ and $t_3$, the output of the integrator represents $$V_{0(n)} = \sum_{k=1}^{N} a(k) V_{IN(n-k)},$$

where $a_k = 1$ if the ith first phase electrode is turned on at time $t_2$ and where $a_k = 0$ if it is turned off at time $t_2$. It is to be noted that the secnd phase electrodes are not clocked, but held at an intermediate potential in a "phase and one half" CCD operating mode. The reset switch on the integrator circuit is closed once per cycle at time $t_1$ to maintain that phase and one half potential.

Again referring to FIG. 4 for greater detail, an input voltage $V_{IN(n)}$ 402 is applied to an operational amplifier 404 providing the binary weighted gain of $2^{-2}$ as the MSB. Three two phase CCD delay stages 406, 408 and 410 are provided in series. Three binary bits of information from a shift register or other means of storage are provided simultaneously to the respective first phase electrodes 412, 414, and 416 of the CCD structures. The three respective second phase electrodes $a_{0,2}$, $a_{1,2}$, and $a_{2,2}$ are tied together in a parallel mode to provide the desired output $V_{0(n)}$ 418.

Block 420 represents the charge transfers through the CCD register during the three clock periods $t_1$, $t_2$, and $t_3$. During time interval $t_1$, the three first phase electrodes have applied thereto a binary signal of 0. As illustrated, the charge packets are contained in the potential wells under the second phase electrodes where the second phase electrodes are held at an intermediate potential. At time $t_2$, the three first phase electrodes are simultaneously applied with three additional binary signals of information having values respectively, 0, 0, and 1. At the time $t_2$, the charge packets under the second phase electrode $a_{1,2}$ is transferred to the first phase electrodes 416 while the charge packets under the second phase electrodes $a_{0,2}$ and $a_{2,2}$ are not transferred. At time $t_3$, 1, 1 and 1 binary signals are simultaneously applied to the first phase electrodes respectively, thereby causing any untransferred charge packets under the second phase electrodes to be transferred to the corresponding adjacent succeeding first phase electrodes. During the time interval $t_2-t_3$, the output of the integrator is sampled, where according to the following description $a_{0,2}$ has a value of 1, $a_{1,2}$ has a value of 0 and $a_{2,2}$ has a value of 1. By applying simultaneously to the three first phase electrodes a signal of 0, the charge packets from the wells under the first phase electrodes are transferred to the wells under the second phase electrodes, thereby completing the first cycle and initializing the CCD structure for a second cycle.

During the time interval $t_2-t_3$, the integrator circuit 422 provides the appropriate output 418 of $$V_{0(n)} = 2^{-2} \sum_{k=0}^{3} a_{k,2} V_{IN(n-k)}.$$

A reset switch 424 is provided to maintain the second phase electrodes at a phase and one half potential by clocking once per cycle at time $t_1$.

Figure 5:
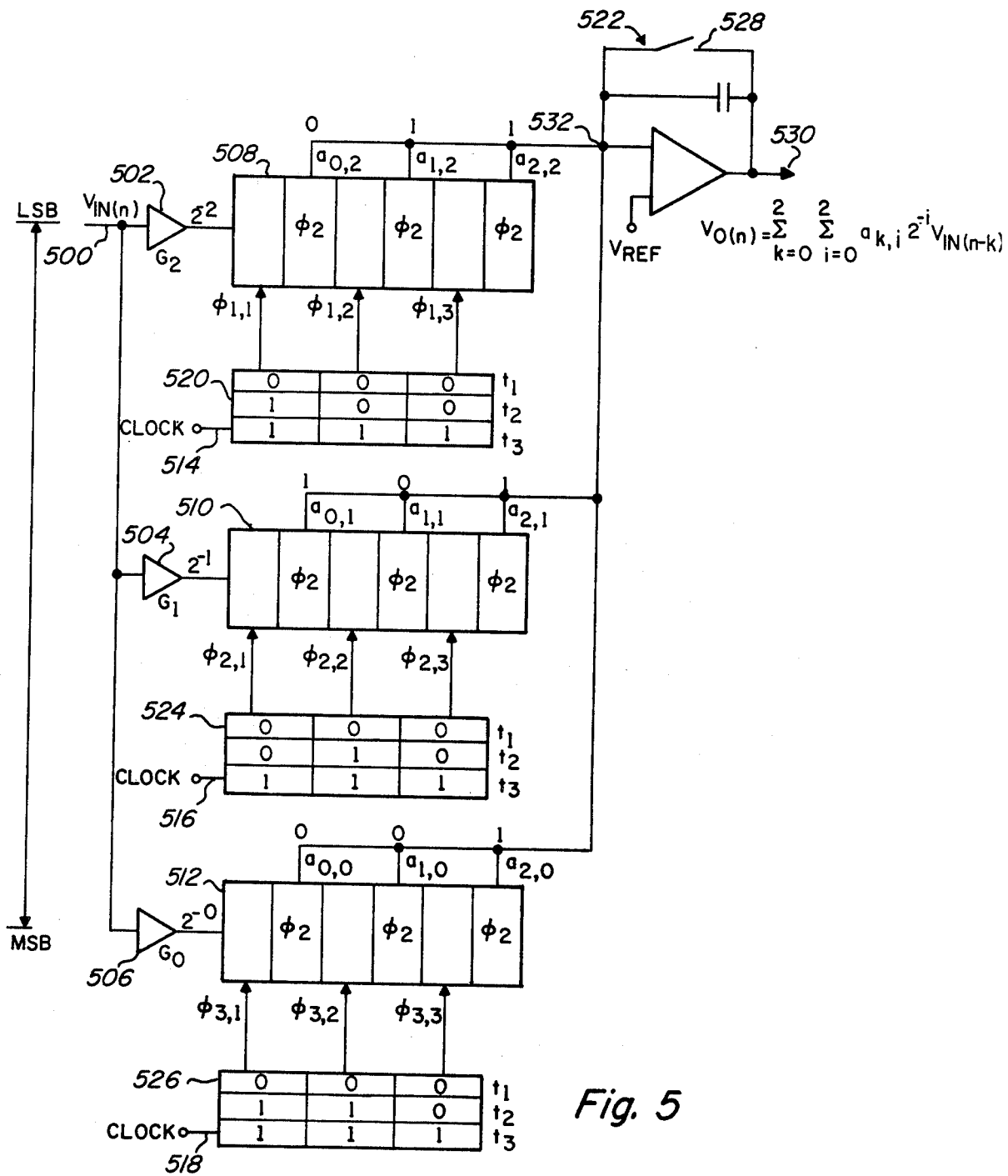
FIG. 5 is a schematic drawing showing the construction of a digitally programmable transversal filter according to the method of the present invention.

In FIG. 5 one embodiment of the present invention comprising a programmable transversal filter is illustrated. The detailed operation of the programmable transversal filter has already been described with reference to FIG. 4 and only a summary description of FIG. 5 will be given. An analog input voltage $V_{IN(n)}$ 500 is applied in parallel to three operational amplifiers 502, 504 and 506 having respective gains of $2^{-2}$, $2^{-1}$, and $2^{-0}$. The signal at operational amplifier 502 represents the LSB term and the signal at the operational amplifier 506 represents the MSB term. As previously indicated, the operational amplifiers 502, 504, and 506 may alternatively be placed at the outputs of the CCD registers. The three banks 508, 510, and 512 of three two phase CCD's provide for a three bit by three correlation. The analog voltage inputs to each register of CCD devices are clocked through the register by means of respective clock signals 514, 516, and 518. The clock signals are only applied to the phase one electrodes as the phase two electrodes are held at the intermediate potential.

For the LSB term storage registers 520, 524 and 526 or other memory means are provided for applying to the first phase electrodes the respective binary signal required to produce the desired programmed output. As illustrated at time $t_1$, the three first phase electrodes $\Phi_{1,1}$ $\Phi_{1,2}$ and $\Phi_{1,3}$ have simultaneously applied thereto a binary value of 0 which was stored in the memory register 520 to initialize the CCD register. At time $t_2$, by way of example, the binary values of 1,0 and 0 are applied respectively to the three first phase electrodes of the CCD register 508. The clock cycle is completed by applying binary signals 1,1 and 1 to each of the respective first phase electrodes, thereby transferring all charges to the wells under the first phase electrodes at time $t_3$. The register 508 is initialized to begin the next charge transfer cycle.

During the time period $t_2$–$t_3$, the output of the convolution operation is performed. According to the binary signals stored in the register 520, the coefficient $a_{0,2}$ has a value of 1, the coefficient $a_{1,2}$ has a value of 0 and the coefficient $a_{2,2}$ also has a value of 0. The outputs from the three second phase electrodes in the CCD register 508 are provided in parallel, being tied to a common communication line to carry the information to a charge circuit integrator 522.

In a similar manner, the CCD registers 510 and 512 are clocked with digital programmed registers or memory banks 524 and 526, respectively. The outputs from the second phase electrodes are connected at point 532 and then fed to the charge circuit integrator. A reset switch 528 is used on the charge circuit integrator to maintain the phase and one half potential on the second phase electrodes by closing per cycle at time $t_1$. The output of the transversal filter is indicated at 530 as $$V_{0(n)} = \sum_{k=0}^{2} \sum_{i=0}^{2} a_{k,i} 2^{-i} V_{IN(n-k)}.$$

In operating the programmable transversal filter in another embodiment, a differential CCD channel transversal filter may be designed. The differential channel for each bit would have one CCD with V[fat zero+signal] applied to its input and the other side having V[fat zero−signal]. The output would be given as $$V_{0(n)} = 2 \sum_{k=0}^{N} \sum_{i=0}^{M} a_{k,i} 2^{-i} V_{IN(n-k)}.$$

Figure 6:
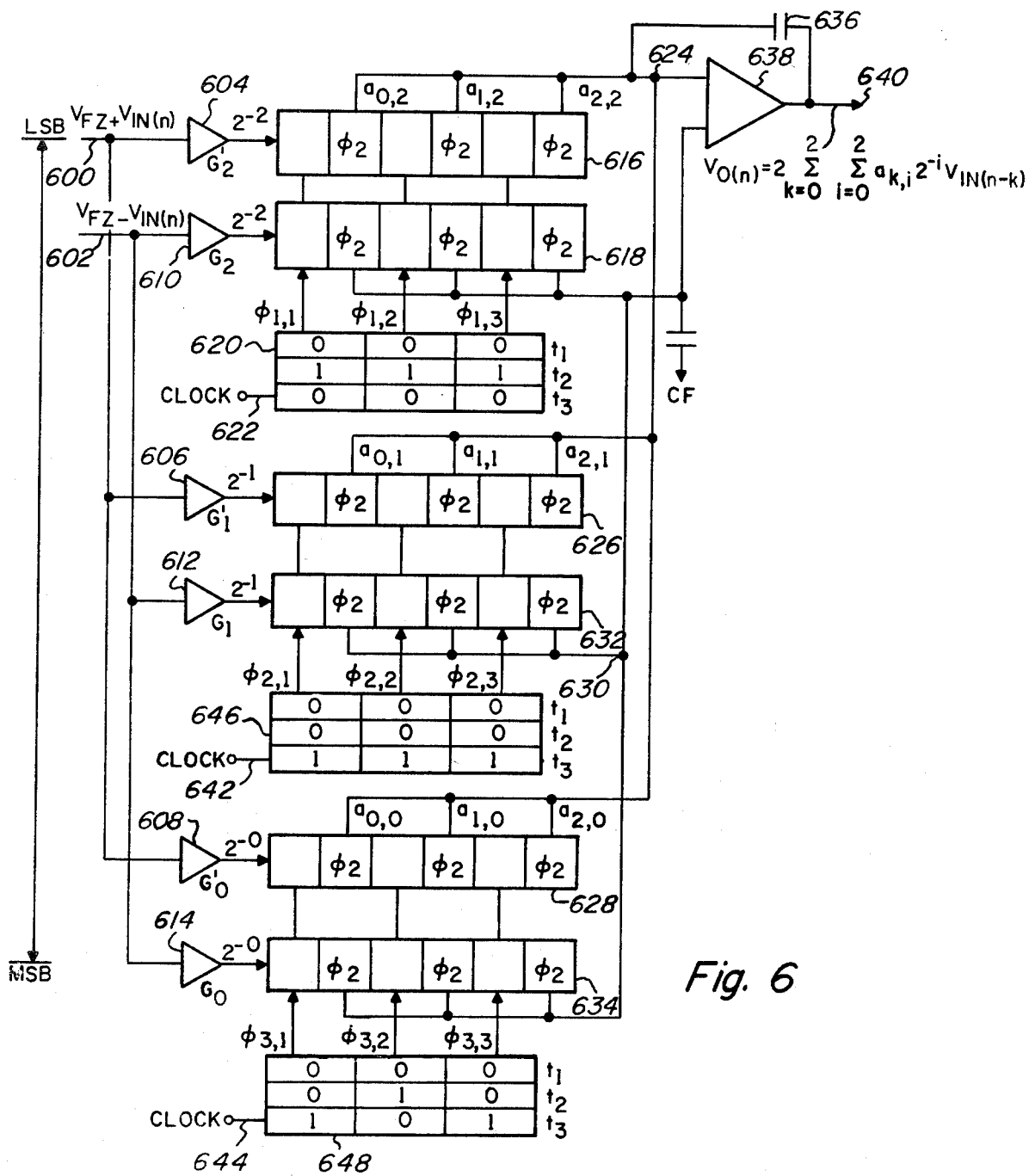
FIG. 6 is a schematic drawing showing a digital programmable differential channel transversal filter constructed according to the method of the present invention.

Referring now to FIG. 6, a schematic diagram of a differential channel CCD programmable transversal filter fabricated according to the method of the present invention is illustrated. The operation of the differential channel transversal filter and its structural embodiment is similar to that already described with reference to FIG. 5. Accordingly, only a summary description will be given. The [fat zero+signal] is inputted at 600 where it is applied in parallel to the gain amplifiers 604, 606 and 608. In a similar manner, the [fat zero−signal] is inputted at 602 where it is applied in parallel to gain amplifiers 610, 612 and 614. As described in the prior embodiment, the gain amplifiers can be located at the outputs of the respective CCD channels.

Each of the programmed coefficients $a_{0,i}$, $a_{1,i}$, and $a_{2,i}$ is obtained by use of two multi-stage CCD shift registers connected in parallel. The LSB bit of the embodiment in FIG. 6 is obtained by the two CCD shift registers 616 and 618 being tied together in a parallel mode where the first phase electrodes of each cell of the CCD registers are tied together to a common binary information line. The binary bits of information that are programmed into the register or memory means 620 are respectively applied by clock means 622 to the respective first phase electrodes of the CCD register banks 616 and 618 simultaneously. In a like manner, the other programmed coefficients from the LSB bit to the MSB bit are obtained.

The second phase electrodes of the CCD register 616 are tied together in series to feed the programmed output to a common node 624 where the corresponding (+) signals outputted from the remaining second phase electrodes of CCD registers 626 and 628 are applied. In a like manner, the second phase electrodes of CCD register 618 are tied together in series and their output applied to a common node 630 having applied thereto the (−) signal outputs from the remaining second phase electrodes of CCD registers 632 and 634.

In the manner previously described, the first phase electrodes of CCD registers 626 and 632 are tied together in series as well as registers 628 and 634 respectively. The binary bits of stored information are applied to the first phase electrodes of these CCD registers as previously described by the respective clock signals by means of clocking means 642 and 644 of their respective memory means 646 and 648.

The outputs from the respective (+) signal and (−) signal registers as indicated are tied to nodes 624 and 630. From there, the analog signals are fed to a charge integrator circuit 636 comprising a differential amplifier 638 whose output 640 is the result of the convolution operation of the programmable differential transversal filter of the present embodiment as given previously.

Figure 7:
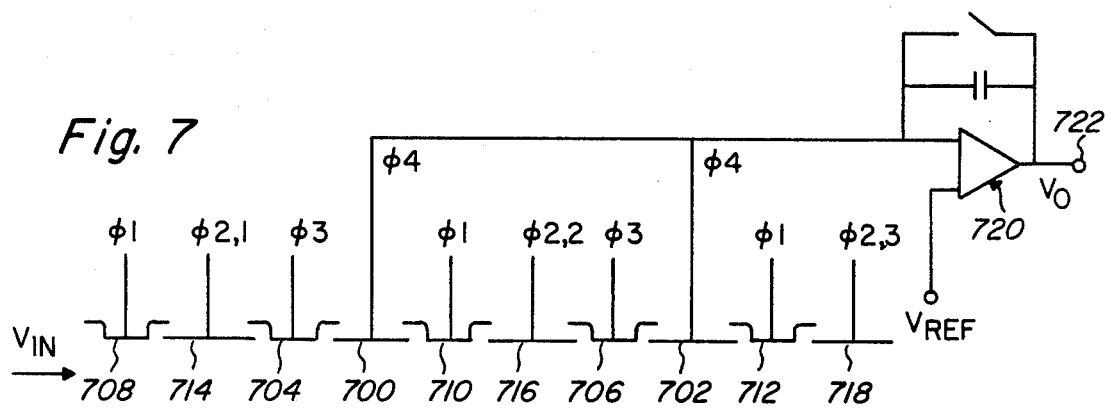
FIG. 7 is a schematic drawing of a four-phase CCD implementation of the present invention.

In FIG. 7, a four phase CCD structural embodiment employing the method of the present invention is illustrated schematically. The convolution operation and programming coefficient operation as a programmable transversal filter is that as already described for the embodiments of FIGS. 5 and 6. The fourth phase sense electrodes 700 and 702 are clamped by the first phase clock and are then left floating at an intermediate potential of about six volts. This allows the fourth phase electrodes to be floating at a potential halfway between an "on" and "off" level in a like manner as previously described. For unidirectional transfer, the third phase electrodes 704 and 706 are set to a lower potential of about two volts, thereby providing a barrier between the second phase electrodes and the fourth phase electrodes. The first phase electrodes 708, 710 and 712 as well as the second phase electrodes 714, 716 and 718 are clocked with the waveforms as sketched in FIG. 8 where the second phase waveforms $\Phi_{2,i}$ for each delay stage may be either of the two forms shown.

One waveform 800 results in a coefficient of binary 1 and the other waveform 802 results in a program coefficient of binary 0. Charge packets under the phase electrodes are transferred to wells under the second phase electrodes between $t_1$ and $t_2$ as indicated from clock $\Phi_1$ waveform 804. The charge transfer from the second phase electrodes to the fourth phase sense electrodes occurs when the second phase electrodes are turned off. By way of example, for CCD cells corresponding to the binary 1 bit, the second phase electrodes turn off at time $t_2$ and the signal charge packets under these electrodes transfer to the fourth phase sense electrodes. For CCD cells corresponding to binary 0, the charge transfer occurs at a later time $t_3$. The integrating output amplifier 720 sums the sensed charge packets that are sampled during the period $t_2$ to $t_3$ to obtain the output signal $V_0$ 722 as previously defined. The second phase waveform can be generated according to a digital code by a dynamic ratio less shift register circuit with feedback to be described. The first phase waveform is generated by a conventional clock cycle.

The embodiment of FIG. 7 can be extended to differential channels for bipolar input signals, and M differential channels can be operated in parallel to obtain a convolver which contains N words by M bits per word as previously described.

It is recognized that the third phase electrodes may be eliminated to obtain a three phase structure. However, undesirable clock coupling from the second phase electrodes on the fourth phase sense electrodes must be compensated for by external coupling. This is especially undesirable, since the clock coupling from the second phase electrodes will become code dependent.

Figure 9:
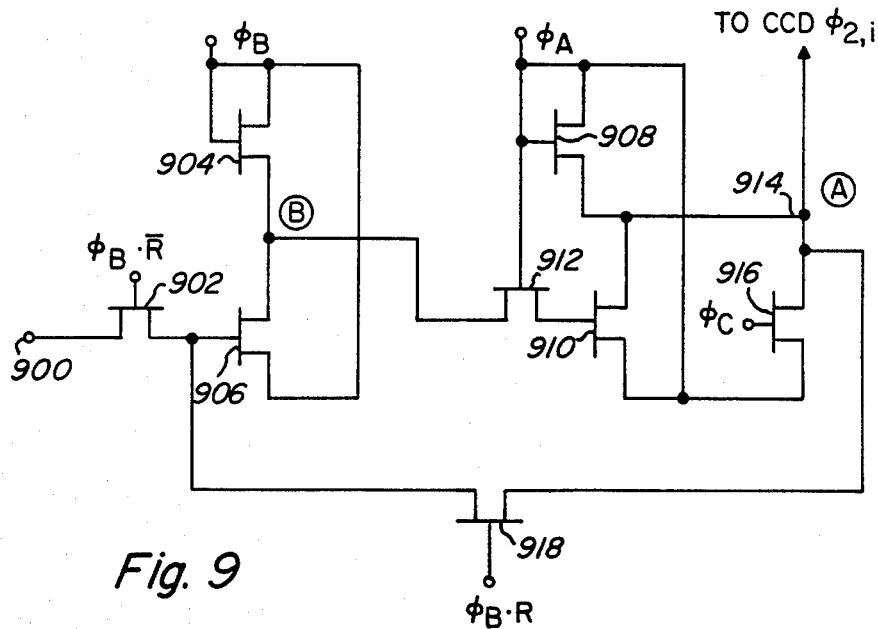
FIG. 9 is a circuit diagram of an MOS single stage dynamic shift register combining data storage and clocking functions which may be used with the present invention.

In FIG. 9, a circuit diagram is illustrated for one stage of a dynamic ratioless serial shift register to be used for providing the programmed binary bits to the second phase electrodes of the four phase programmable filter which combines both the data storage for programming the transversal filter as well as the clocking function for electrical charge transfer therethrough. A unique feature of the serial register circuit is that it automatically clocks the charge coupled device with the stored program. The serial register is fabricated from a plurality of metal oxide semiconductor (MOS) transistors. These transistors may be fabricated by techniques known to those skilled in the art.

A first inverter circuit is provided comprising two transistors 904 and 906 tied together where transistor 904 acts as a load by tying its drain to its gate. The first inverter circuit is operated by a clock pulse $\phi_B$ which is applied to the drain and gate of transistor 904 and to the source of the inverting transistor 906. A second inverter circuit is provided also comprising two transistors 908 and 910. Transistor 908 acts as a load transistor in a like manner to transistor 904, and transistor 910 acts as an inverting transistor in a like manner to transistor 906. The second inverting circuit has a clock pulse $\phi_A$ connected in a like manner to clock pulse $\phi_B$ of the first inverting circuit. The first and second inverting circuits are connected together by a sample gate 912 which is operated by the clock pulse $\phi_A$ which allows the transfer of data from the first inverter circuit to the second inverter circuit.

Data at point 900 is inputted into the serial register through an input gate 902. The output of the input gate is connected to the gate of the inverting transistor 906 of the first inverter circuit. The input gate is operated by a clock pulse $\phi_B \cdot \overline{R}$ which is applied by the clock pulse $\phi_B$ of the first inverter circuit.

The data stored within the serial register is recirculated from the output of the second inverter circuit to the input of the first inverter circuit by means of a recirculating gate 918. The recirculating gate is operated by a clock pulse $\phi_B \cdot R$ applied to the gate of transistor 918. This clock pulse is also obtained from the $\phi_B$ clock pulse of the first inverter circuit.

An output pull down gate 916 is connected between the output of the second inverter circuit and the clock pulse line $\phi_A$. The output pull down gate is operated by a clock pulse $\Phi_C$ applied to its gate.

By applying the appropriate pulse control signals $\phi_B \cdot \overline{R}$ to transistor 918, the binary data may be recirculated within the stage of the shift register, or by applying the control signal $\phi_B \cdot \overline{R}$ to transistor 902, new data may be serially loaded into the stage of the shift register. Any number of stages may be tied together to provide the necessary stored binary data for the programmable transversal filter as described in the present specification.

The serial shift register is operated by three non-overlapping clock pulses $\phi_A$, $\phi_B$ and $\phi_C$. During a first time period, a clock pulse $\phi_B$ is applied to the first inverter circuit and simultaneously applied either to the input gate 902 for inputting new data from a prior stage or to the recirculating gate 918 to recirculate data from the output of the second inverter circuit. When clock pulse $\phi_B$ goes to its high potential value, the input from the prior cell or the recirculated data is gated onto the gate of transistor 906. In addition, node Ⓑ is precharged to a high potential through the clock supply $\phi_B$ (paths 904 and/or 906). As the clock pulse $\phi_B$ goes to its zero level, the gate of transistor 906 retains its initial charge and is electrically isolated by transistors 902 and 918 from the input voltage 900 and the output of the second inverter circuit. If transistor 906 is conducting, node Ⓑ discharges to the $\Phi_B 32\ 0$ voltage level through transistor 906. If transistor 906 is not conducting, node Ⓑ remains at a high potential. This achieves a logic inversion of the input data onto node Ⓑ.

The second inverter circuit is operated by a clock pulse $\phi_A$. Clock pulse $\phi_A$, in addition to being applied to the second inverter circuit, also is applied to the sample gate 912 to allow the transfer of data from the first inverter circuit to the second inverter circuit. The input on the second inverter circuit is that which now appears at node Ⓑ of the first inverter circuit. The second inverter circuit operates in a like manner to that already described for the first inverter circuit. The output of the second inverter circuit is node Ⓐ.

The output potential at node Ⓐ is the second phase electrode of the four phase CCD transversal filter. If the potential at node Ⓐ is at a high value, it is necessary to pull down that potential during the next clock cycle in order to cause the charge transfer in the CCD from the second phase electrode to the fourth phase electrode. In this regard, the output pull down gate 916 is provided. The source of the transistor 916 is tied to the clock line $\phi_A$ or any low potential such as ground. During the non-overlapping clock pulse $\phi_C$ being applied to the gate of transistor 916, transistor 916 turns on providing a conductive path from node Ⓐ and the second phase electrode of the charge coupled device to the clock line $\phi_A$. Since clock pulse $\phi_A$ is at low potential, this allows the high potential at node Ⓐ to drain down. The $\phi_C$ clock waveform must turn on transistor 916 after the $\phi_B$ clock and before the $\phi_A$ clock in order to retain the information in the shift register.

Figure 8:
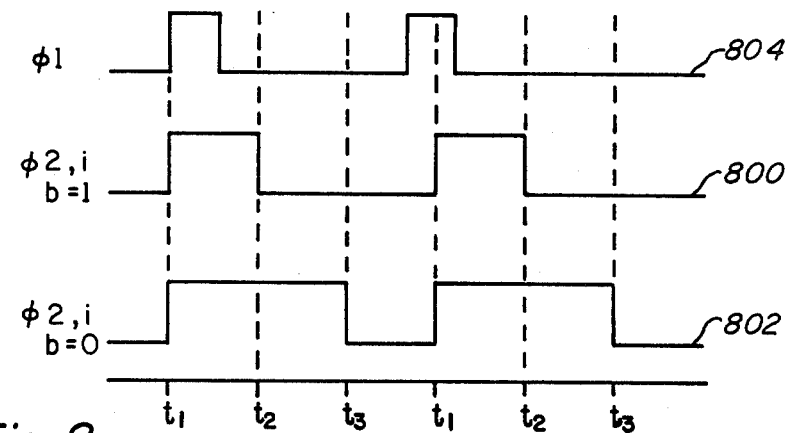
FIG. 8 graphically illustrates waveforms for the implementation of the four-phase CCD embodiment of the present invention.
Figure 10:
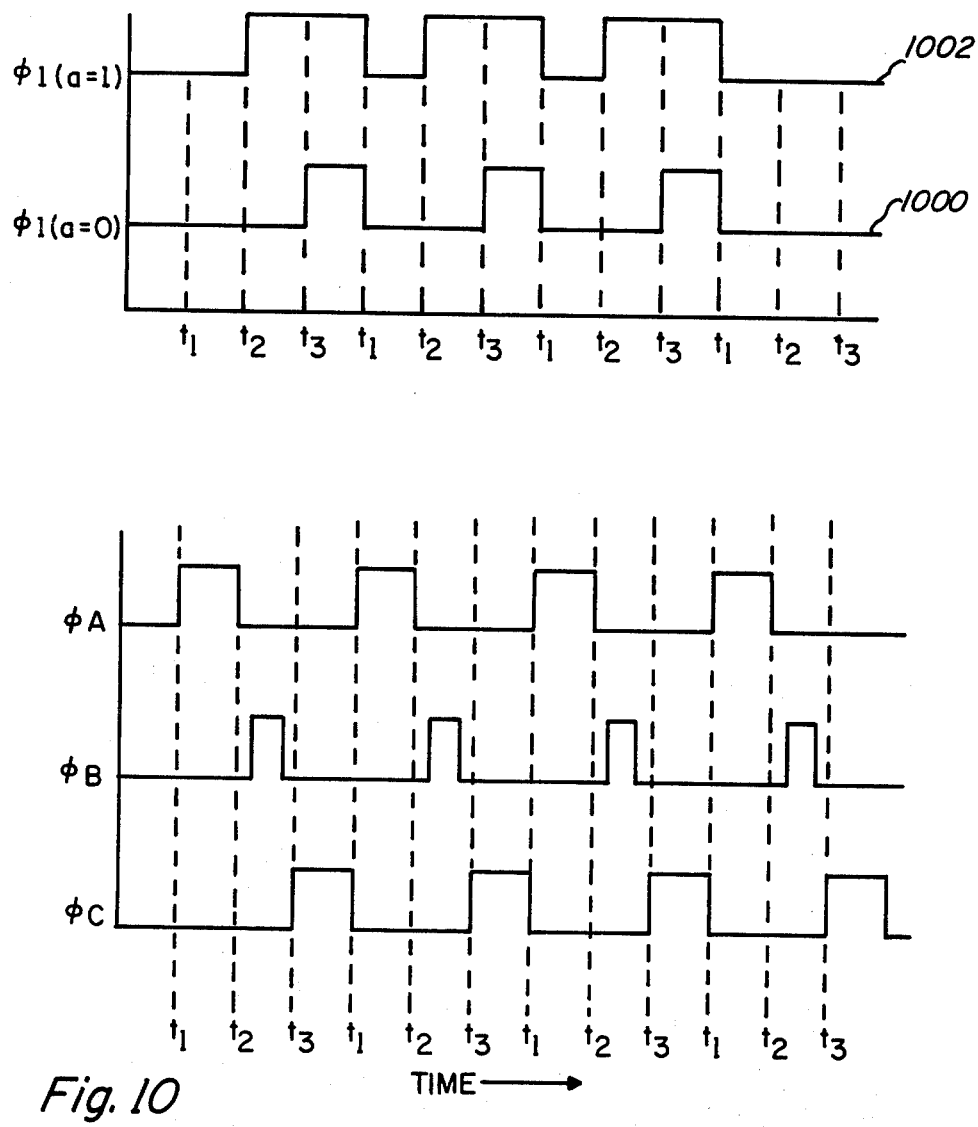
FIG. 10 graphically illustrates waveforms of the circuit shown in FIG. 9.

Briefly referring to FIG. 10, the waveforms for the $\phi_A$, $\phi_B$ and $\phi_C$ clock pulses are schematically illustrated for the time intervals $t_1$, $t_2$ and $t_3$ which represent a complete cycle for the performance of the programmable transversal filter. In addition, the waveforms generated by these clock pulses that are outputted to the CCD structure to the second phase electrodes which gives a programmed coefficient of either binary 0 or a programmed coefficient of binary 1 are illustrated as waveforms 800 and 802 as illustrated in FIG. 8.

The waveforms 1002 and 1000 are those required to be applied to the first phase electrodes of the two phase CCD structure to obtain the desired programmed output. These waveforms are the inverse of those for the four phase CCD structure. These waveforms are generated by a serial register having appropriate output buffering circuitry.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A programmable charge-transfer filter comprising:
    a first plurality of charge-transfer delay stages connected in series, each of said delay stages defining a digital coefficient of a programmable tap weight, each of said delay stages having a plurality of electrodes operative to transfer analog information in the form of electrical charge through each of said delay stages, at least one of said electrodes from each of said delay stages connected to a common communication line defining sense electrodes;
    means for applying binary signals to said electrodes to transfer said analog information through said plurality of delay stages, said information being transferred from one said delay stage to a succeeding said delay stage during a plurality of clock periods defining a clock cycle, said applying means operative to selectively transfer said electrical charge to a position under selected sense electrodes during one said clock period;
    means for sensing the presence or absence of said transferred electrical charge under said sense electrodes, said presence of electrical charge defining a binary 1 coefficient, said absence of electrical charge defining a binary 0 coefficient; and
    means for summing said sensed electrical charge to provide an output voltage proportional to the sum of said transferred electrical charge.

2. A filter as set forth in claim 1 further including means operably associated with said plurality of delay stages for applying a gain factor to said electrical charge.

3. A filter as set forth in claim 1 further including a second plurality of said charge-transfer delay stages, said second plurality being connected in parallel with said first plurality of charge-transfer delay stages to a common input source, and said sense electrodes of all of said delay stages of said first and second pluralities of charge-transfer delay stages being connected to said common communication line.

4. A programmable charge-transfer filter comprising:
    first and second pluralities of charge-transfer delay stages respectively connected in series, each of said delay stages included in said first and second pluralities of delay stages defining a digital coefficient of a programmable tap weight, each of said delay stages having a plurality of electrodes operative to transfer analog information in the form of electrical charge through each of said delay stages in the respective plurality of delay stages, at least one of said electrodes from each of said delay stages included in a respective plurality of delay stages defining a sense electrode and being connected to a common communication line with the other sense electrodes of the same plurality of delay stages;
    the other said electrodes of each delay stage of said first plurality of delay stages being connected to a like electrode of a corresponding delay stage of said second plurality;
    first and second input sources respectively connected to said first and second pluralities of delay stages;
    means for applying binary signals to said electrodes of said delay stages to transfer said analog information through said first and second pluralities of delay stages, said information being transferred from one said delay stage to a succeeding said delay stage during a plurality of clock periods defining a clock cycle, said applying means being operative to selectively transfer said electrical charges to positions under selected sense electrodes of the respective said first and second pluralities of delay stages during one said clock period;
    means for sensing the presence or absence of said transferred electrical charges under said sense electrodes, said presence of electrical charge defining a binary 1 coefficient, said absence of electrical charge defining a binary 0 coefficient; and
    differential summing means connected to said sense electrodes of said delay stages included in each of the respective first and second pluralities of delay stages via the common communication lines corresponding thereto, said differential summing means providing an output voltage proportional to the sum of said transferred electrical charges in response to receiving the sensed electrical charges from said sense electrodes of the respective first and second pluralities of delay stages.

5. A filter as set forth in claim 4 wherein each of said first and second pluralities of charge-transfer delay stages further includes plural sets of said charge-transfer delay stages.

6. A programmable charge-transfer filter comprising:
    a first plurality of charge-transfer delay stages connected in series, each of said delay stages defining one digital coefficient of a programmable tap weight, each of said delay stages having a plurality of electrodes operative to transfer analog information in the form of electrical charge through each of said delay stages; at least one of said electrodes from each of said delay stages connected to a common communication line defining sense electrodes;
    means for applying binary signals to said electrodes to transfer said analog information through said plurality of delay stages, said information being transferred from one said delay stage to a succeeding said delay stage during a plurality of clock periods defining a clock cycle, said applying means operative to selectively remove said electrical charge from under selected sense electrodes during one said clock period;
    means for sensing the removal or non-removal of said electrical charge from under said sense electrodes, said removal of electrical charge defining a binary 1 coefficient, said non-removal of electrical charge defining a binary 0 coefficient, and
    means for summing said sensed electrical charge to provide an output voltage proportional to the sum of said removed electrical charge.

7. A filter as set forth in claim 6 further including means operably associated with said plurality of delay stages for applying a gain factor to said electrical charge.

8. A filter as set forth in claim 6 further including a second plurality of said charge-transfer delay stages, said second plurality being connected in parallel with said first plurality of charge-transfer delay stages to a common input source, and said sense electrodes of all of said delay stages of said first and second pluralities of charge-transfer delay stages being connected to said common communication line.

9. A programmable charge-transfer filter comprising:
first and second pluralities of charge-transfer delay stages respectively connected in series, each of said delay stages included in said first and second pluralities of delay stages defining a digital coefficient of a programmable tap weight, each of said delay stages having a plurality of electrodes operative to transfer analog information in the form of electrical charge through each of said delay stages in the respective plurality of delay stages, at least one of said electrodes from each of said delay stages included in a respective plurality of delay stages defining a sense electrode and being connected to a common communication line with the other sense electrodes of the same plurality of delay stages;
the other said electrodes of each delay stage of said first plurality of delay stages being connected to a like electrode of a corresponding delay stage of said second plurality;
first and second input sources respectively connected to said first and second pluralities of delay stages;
means for applying binary signals to said electrodes of said delay stages to transfer said analog information through said first and second pluralities of delay stages, said information being transferred from one said delay stage to a succeeding said delay stage during a plurality of clock periods defining a clock cycle, said applying means being operative to selectively remove said electrical charges from under selected sense electrodes of the respective said first and second pluralities of delay stages during one said clock period;
means for sensing the removal or non-removal of said electrical charges from under said sense electrodes, said removal of electrical charge defining a binary 1 coefficient, said non-removal of electrical charge defining a binary 0 coefficient; and
differential summing means connected to said sense electrodes of said delay stages included in each of the respective first and second pluralities of delay stages via the common communication lines corresponding thereto, said differential summing means providing an output voltage proportional to the sum of said removed electrical charges in response to receiving the sensed electrical charges from said sense electrodes of the respective first and second pluralities of delay stages.

10. A filter as set forth in claim 9 wherein each of said first and second pluralities of charge-transfer delay stages further includes plural sets of said charge-transfer delay stages.

11. A filter as set forth in claim 10 further including means operably associated with the plural sets of each of said first and second pluralities of delay stages for applying a gain factor to said electrical charge.

12. A digitally programmable charge-transfer filter comprising:
a first plurality of charge-transfer delay lines connected in parallel to a common input source, each of said delay lines including a plurality of delay stages connected in series, each of said delay stages defining a digital coefficient of a programmable tap weight defined by each of said delay lines, each of said delay stages having first and second electrodes operative to transfer analog information in the form of electrical charge through each of said delay stages, said second electrodes of each of said delay stages connected to a common communication line;
means for applying digital information to said respective first electrodes to transfer said electrical charge through said plurality of delay stages, said electrical charge being transferred from under a selected second electrode to under a said first electrode of a respective succeeding delay stage during a clock period, a plurality of clock periods defining a clock cycle operative to transfer said electrical charge through a respective delay stage to a succeeding said delay stage;
means for sensing the transfer of said electrical charge from under said selected second electrode of a respective said delay stage to under a said first electrode of a succeeding said delay stage, said transfer of said electrical charge defining a digital 1 coefficient, the non-transfer of said electrical charge defining a digital 0 coefficient; and
means for summing said sensed electrical charge to provide an output voltage proportional to the sum of said transferred charge.

13. A filter as set forth in claim 12 wherein said means for applying digital information comprises a serial shift register.

14. A digitally programmable charge-transfer filter comprising:
first and second pluralities of charge-transfer delay lines, each of said delay lines included in said first and second pluralities of delay lines comprising a plurality of delay stages connected in series, each of said delay stages defining a digital coefficient of a programmable tap weight defined by each of said delay lines, each of said delay stages having first and second electrodes operative to transfer analog information in the form of electrical charge through each of said delay stages in the respective plurality of delay stages, said second electrodes from each of said delay stages included in a respective plurality of delay stages being connected to a common communication line;
first and second input sources, said first plurality of delay lines being connected in parallel to said first input source and said second plurality of delay lines being connected in parallel to said second input source;
said first electrodes of each of said respective delay stages of said first plurality of delay lines being connected to said first electrodes of a corresponding delay stage of said second plurality of delay lines;
means for applying digital information to said respective first electrodes of said delay stages to transfer said electrical charge through said delay stages, said electrical charge being transferred from under a selected second electrode to under a said first electrode of a respective succeeding delay stage during a clock period, a plurality of clock periods defining a clock cycle operative to transfer said electrical charge through a respective delay stage to a succeeding said delay stage;
means for sensing the transfer of said electrical charge from under said selected second electrode of a respective said delay stage to under a said first electrode of a succeeding said delay stage, said transfer of said electrical charge defining a digital 1 coefficient, the non-transfer of an electrical charge defining a binary 0 coefficient; and differential summing means connected to said second electrodes of said delay stages included in each of the respective first and second pluralities of delay lines via the common communication lines corresponding thereto, said differential summing means providing an output voltage proportional to the sum of said transferred electrical charges in response to receiving the sensed electrical charges from said second electrodes of the respective first and second pluralities of delay lines.

15. A digitally programmable charge-transfer filter comprising:

a first plurality of charge-transfer delay lines connected in parallel to a common input source, each of said delay lines including a plurality of delay stages connected in series, each of said delay stages defining a digital coefficient of a programmable tap weight defined by each of said delay lines, each of said delay stages having first, second, third and fourth electrodes operative to transfer electrical charge through each of said delay stages, said fourth electrodes of each of said delay stages connected to a common communication line;

means for applying binary information to said respective first and second electrodes to transfer said electrical charge through said plurality of delay stages, said electrical charge being selectively transferred to under a said selected fourth electrode of a respective delay stage during a clock period, a plurality of clock periods defining a clock cycle operative to transfer said electrical charge through a respective delay stage;

means for sensing the presence of said electrical charge under a said selected fourth electrode, said sensed presence of said electrical charge defining a binary 1 coefficient, the absence of said electrical charge defining a binary 0 coefficient; and means for summing said sensed electrical charge to provide an output voltage proportional to the sum of said electrical charge present.

16. A digitally programmable charge-transfer filter comprising:

first and second pluralities of charge-transfer delay lines, each of said delay lines comprising a plurality of delay stages connected in series, each of said delay stages defining a digital coefficient of a programmable tap weight defined by each of said delay lines, each of said delay stages having first, second, third and fourth electrodes operative to transfer analog information in the form of electrical charge through each of said delay stages, said fourth electrodes of each of said delay stages included in a respective plurality of delay stages being connected to a common communication line;

first and second input sources, said first plurality of delay lines being connected in parallel to said first input source and said second plurality of delay lines being connected in parallel to said second input source;

said first and second electrodes of each of said respective delay stages of said first plurality of delay lines being connected to said first and second electrodes of a corresponding delay stage of said second plurality of delay lines;

means for applying binary information to said respective first and second electrodes to transfer said electrical charge through said plurality of delay stages, said electrical charge being selectively transferred to under a said selected fourth electrode of a respective delay stage during a clock period, a plurality of clock periods defining a clock cycle operative to transfer said electrical charge through a respective delay stage to a succeeding said delay stage;

means for sensing the presence of said electrical charge under a said selected fourth electrode, said sensed presence of said electrical charge defining a binary 1 coefficient, the absence of said electrical charge defining a binary 0 coefficient; and differential summing means connected to said fourth electrodes of said delay stages included in each of the respective first and second pluralities of delay lines via the common communication lines corresponding thereto, said differential summing means providing an output voltage proportional to the sum of said transferred electrical charges in response to receiving the sensed electrical charges from said fourth electrodes of the respective first and second pluralities of delay lines.

17. A filter as set forth in claim 15 further including means for applying a selected gain factor to said electrical charge in each of said respective delay lines.

18. A method of processing analog signals by employing a charge-transfer filter having a digitally programmed tap weight and comprising a first plurality of charge-transfer delay stages connected in series, wherein each of said delay stages defines a digital coefficient of said tap weight, each of said delay stages has a plurality of electrodes operative to transfer analog information in the form of electrical charge through each of said delay stages, and at least one of said electrodes from each of said delay stages is connected to a common communication line defining sense electrodes; comprising the steps of:

applying binary signals to said electrodes to selectively transfer said analog information through said plurality of delay stages, said information being transferred from one said delay stage to a succeeding said delay stage during a plurality of clock periods defining a clock cycle, the application of binary signals to said electrodes being operative to selectively transfer said electrical charge to under selected said sense electrodes during one said clock period;

sensing the presence or absence of said transferred electrical charge under said sense electrodes, said presence of electrical charge defining a binary 1 coefficient, said absence of electrical charge defining a binary 0 coefficient; and summing said sensed electrical charge to provide an output proportional to the sum of said electrical charge present.

19. A method as set forth in claim 18 further including the step of applying a gain factor to said electrical charge.

20. A method as set forth in claim 18 wherein the charge-transfer filter has a second plurality of charge-transfer delay stages connected in parallel with said first plurality to a common input source, and said sense electrodes of all of said delay stages of said first and second pluralities of charge-transfer delay stages are connected to said common communication line; further including applying a plurality of said binary signals to selectively transfer electrical charge through each of said first and second pluralities of delay stages.

21. A method as set forth in claim 20 further including the step of applying a gain factor to said electrical charge.

22. A method as set forth in claim 18 wherein the charge-transfer filter has a second plurality of charge-transfer delay stages; further including applying said sensed electrical charge from said first and second pluralities of charge-transfer delay stages to a means for differential summing in the summing thereof.

23. A method of processing analog signals by employing a charge-transfer filter having a digitally programmed tap weight and comprising a first plurality of charge-transfer delay stages connected in series, wherein each of said delay staged defines a digital coefficient of said tap weight, each of said delay stages has a plurality of electrodes operative to transfer analog information in the form of electrical charge through each of said delay stages, and at least one of said electrodes from each of said delay stages is connected to a common communication line defining sense electrodes; comprising the steps of;

applying binary signals to said electrodes to selectively transfer said analog information through said plurality of delay stages, said information being transferred from one said delay stage to a succeeding said delay stage during a plurality of clock periods defining a clock cycle, the application of binary signals to said electrodes being operative to selectively remove said electrical charge from under selected said sense electrodes during one said clock period;

sensing the removal or non-removal of said electrical charge from under said sense electrodes, said removal of electrical charge defining a binary 1 coefficient, said non-removal of electrical charge defining a binary 0 coefficient; and summing said sensed electrical charge to provide an output voltage proportional to the sum of said removed electrical charge.

24. A method as set forth in claim 23 wherein the charge-transfer filter has a second plurality of charge-transfer delay stages connected in parallel with said first plurality to a common input source, and said sense electrodes of all of said delay stages of said first and second pluralities of charge-transfer delay stages are connected to said common communication line; further including applying a plurality of said binary signals to selectively transfer electrical charge through each of said first and second pluralities of delay stages.

25. A method as set forth in claim 23 wherein the charge-transfer filter has a second plurality of charge-transfer delay stages; further including applying said sensed electrical charge from said first and second pluralities of charge-transfer delay stages to a means for differential summing in the summing thereof.

26. A method of processing analog signals by employing a charge-transfer filter having a digitally programmed tap weight and comprising a first plurality of charge-transfer delay lines connected in parallel to a common input source, each of said delay lines including a plurality of delay stages connected in series, wherein each of said delay stages defines a digital coefficient of said tap weight defined by each of said delay lines, each of said delay stages has first and second electrodes operative to transfer analog information in the form of electrical charge through each of said delay stages, and said second electrode of each of said delay stages is connected to a common communication line; comprising the steps of:

applying digital information to said respective first electrodes to transfer said electrical charge through said plurality of delay stages, said electrical charge beng transferred from under a selected second electrode to under a said first electrode of a respective succeeding delay stage during a clock period;

sensing the transfer of said electrical charge from under said second electrode of a respective said delay stage to under said first electrode of a succeeding said delay stage, said transfer of said electrical charge defining a digital 1 coefficient, the non-transfer of said electrical charge defining a digital 0 coefficient; and summing said sensed electrical charge to provide an output voltage proportional to the sum of said transferred electrical charge.

27. A method as set forth in claim 26 further including the step of applying a gain factor to said electrical charge.

28. A method as set forth in claim 26 wherein the charge-transfer filter has a second plurality of charge-transfer delay lines; further including the step of applying said sensed electrical charge from said first and second pluralities of charge-transfer delay lines to a means for differential summing in the summing thereof.

29. A method as set forth in claim 28 further including the step of applying a selected gain factor to each of said delay lines of said first and second pluralities of delay lines.

30. A method of processing analog signals by employing a charge-transfer filter having a digitally programmed tap weight and comprising a first plurality of charge-transfer delay lines connected in parallel to a common input source, each of said delay lines including a plurality of delay stages connected in series, wherein each of said delay stages defines a digital coefficient of said tap weight defined by each of said delay lines, each of said delay stages has first, second, third and fourth electrodes operative to transfer electrical charge through each of said delay stages, and said fourth electrode of each of said delay stages is connected to a common communication line; comprising the steps of:

applying binary information to said respective first and second electrodes to transfer said electrical charge through said plurality of delay stages, said electrical charge selectively transferred to under said fourth electrode of a respective delay stage during a clock period;

sensing the presence of said electrical charge under said fourth electrode, said sensed presence of said electrical charge defining a digital 1 coefficient, the absence of said electrical charge defining a digital 0 coefficient; and summing said sensed electrical charge to provide an output voltage proportional to the sum of said electrical charge present.

31. A method as set forth in claim 30 wherein the charge-transfer filter has a second plurality of charge-transfer delay lines; further including applying said sensed electrical charge from said first and second pluralities of charge-transfer delay lines to a means for differential summing in the summing thereof.

32. A filter as set forth in claim 1, 6, 12 or 15 further including in combination a shift register comprising:

first and second inverter circuit means each including an input and output, said output of said second inverter circuit means connected to said filter providing clocking functions and programming data;

sample gate means connecting said first and second inverter circuit means together for data transfer therebetween;

recirculating gate means connecting the output of said second inverter circuit means to the input of said first inverter circuit means; and output pull down means connected between the output of said second inverter circuit means and a source of low potential.

* * * * *